United States Patent [19]

Merrill

[11] 4,135,625
[45] Jan. 23, 1979

[54] MULTI-COMPARTMENT CONTAINER FOR FRAGILE DISKS

[76] Inventor: Kenneth V. Merrill, 617 Crescent Ave., San Mateo, Calif. 94402

[21] Appl. No.: 854,959

[22] Filed: Nov. 25, 1977

Related U.S. Application Data

[63] Continuation-in-part of Ser. No. 704,136, Jul. 12, 1976, abandoned.

[51] Int. Cl.² ............................................. B65D 85/30
[52] U.S. Cl. ..................................... 206/445; 206/1.5; 206/332; 206/563; 206/583; 220/4 B
[58] Field of Search ............... 206/183, 184, 328, 329, 206/332, 334, 445, 471, 461, 485, 309, 521, 1.5, 443, 446, 53, 403, 563, 583, 587, 509, 594, 805; 229/14 C, 2.5 R, 2.5 EC; 220/4 B, 4 E

[56] References Cited

U.S. PATENT DOCUMENTS

| | | | |
|---|---|---|---|
| 563,675 | 7/1896 | Mullins | 220/4 E |
| 3,136,413 | 6/1964 | Hall | 206/305 |
| 3,164,478 | 1/1965 | Bostrom | 206/445 |
| 3,223,234 | 12/1965 | Weiss | 206/587 |
| 3,396,867 | 8/1968 | Garriga | 220/4 E |
| 3,487,921 | 1/1970 | Barth et al. | 206/583 |
| 3,948,455 | 4/1976 | Schwartz | 206/394 |
| 4,043,451 | 8/1977 | Johnson | 206/334 |

FOREIGN PATENT DOCUMENTS

| | | | |
|---|---|---|---|
| 531715 | 10/1956 | Canada | 206/445 |
| 1351992 | 12/1963 | France | 206/445 |

Primary Examiner—William Price
Assistant Examiner—Bruce H. Bernstein
Attorney, Agent, or Firm—Townsend and Townsend

[57] ABSTRACT

A flexible multi-compartment container is provided for the storage, handling and shipping of fragile disks such as silicon wafers used in the manufacture of integrated circuits. The container comprises a generally tubular hollow bellows section formed of identical longitudinal halves from thin sheets of pliant self-supportable plastic sheet material. Each fold of the bellows section defines an interior annular groove forming a compartment for a disk of corresponding pre-selected or standardized size. Integral with the bellows section are longitudinally flexible end spacers of a diameter greater than the diameter of the bellows section. Each end spacer includes ridges adapted to confront the interior of a rigid outer box for suppotring the bellows section therein. In particular embodiments, the end spacers include an exterior annular ridge and adjacent trough for receiving a rubber band which is used to hold the mating halves together. The annular ridges include an indentation of suitable size to accommodate the insertion of a finger beneath the rubber band in the trough in order to expedite the release of the rubber band and the opening of the container. In addition, each halve of the bellows section includes a longitudinal lip on one side margin and along the opposing side margin an integrally formed resilient longitudinal catch. The catch is formed as a longitudinal fold of an extension of the longitudinal lip. In addition, a longitudinal stiffening backbone is formed along the outer surfaces of the bellows section between the side margins to prevent sag between the end spacers.

6 Claims, 8 Drawing Figures

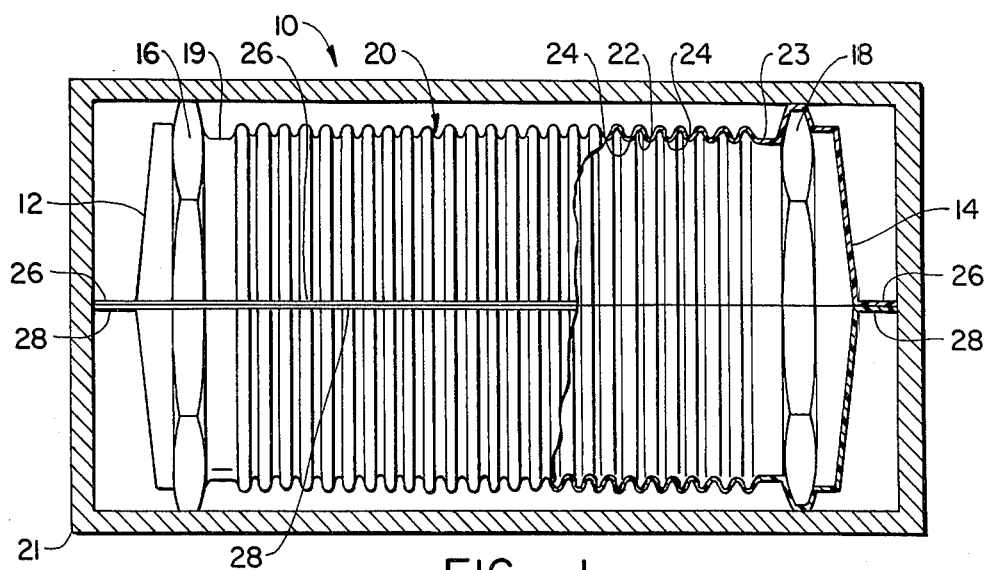
FIG._1.
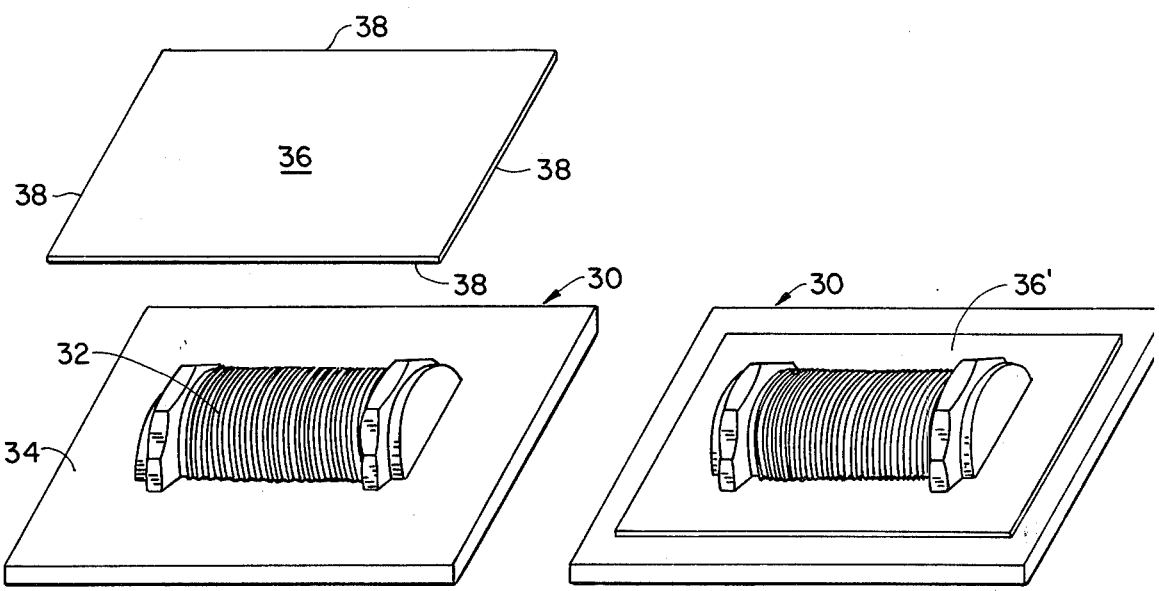
FIG._2.  FIG._3.
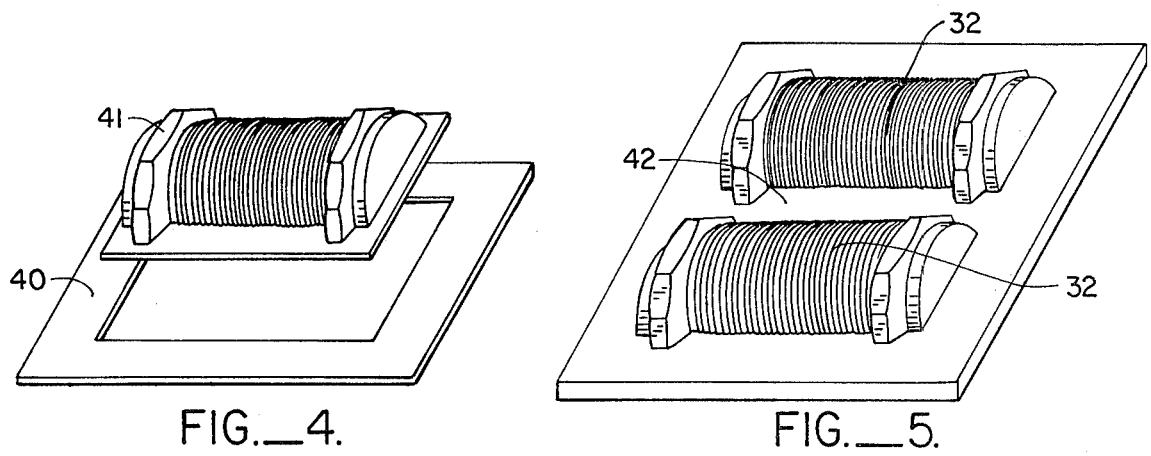
FIG._4.  FIG._5.

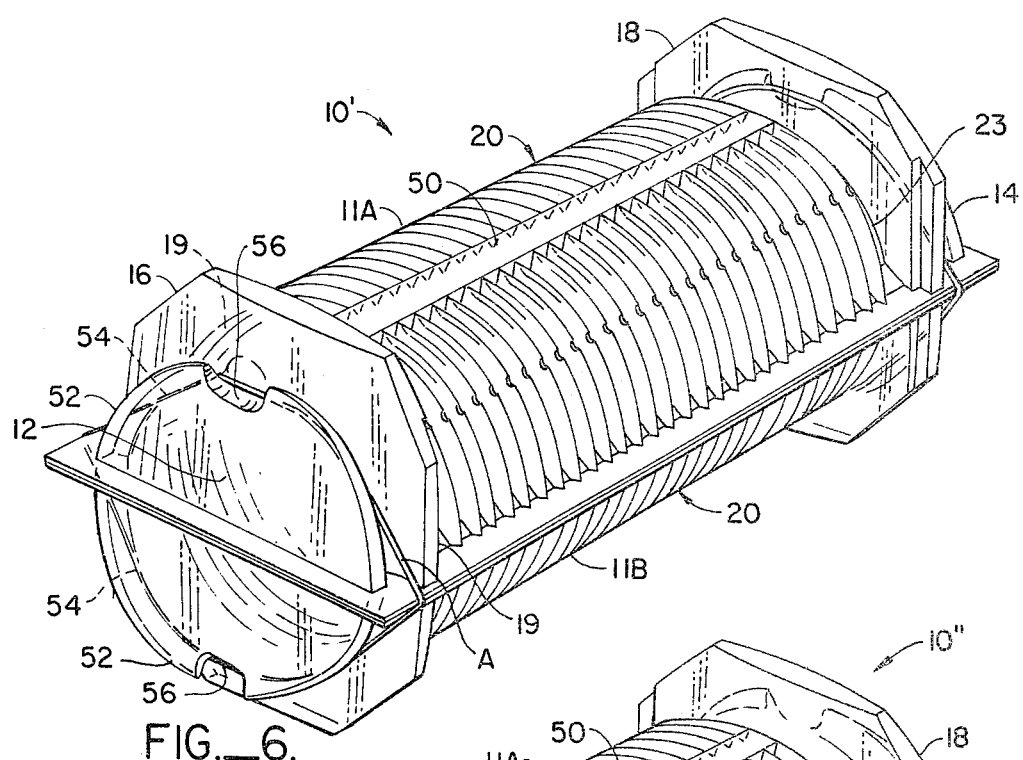
FIG._6.
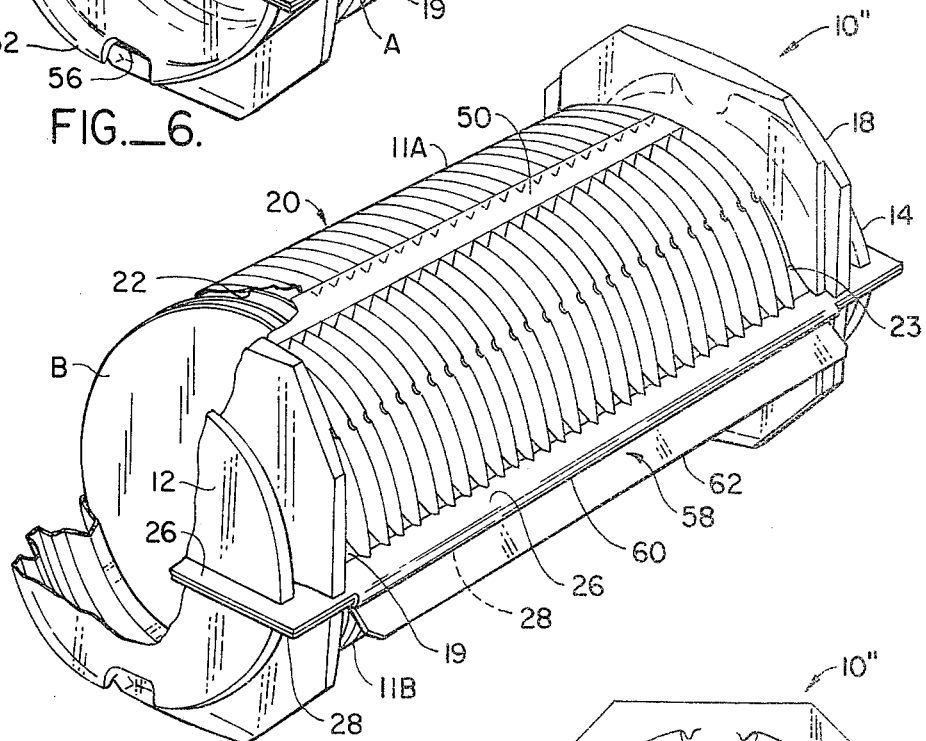
FIG._7.
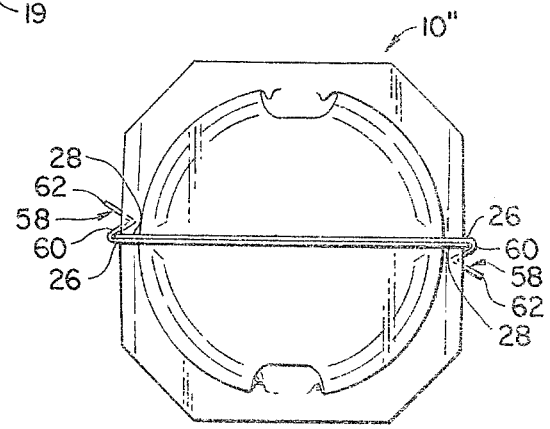
FIG._8.

MULTI-COMPARTMENT CONTAINER FOR FRAGILE DISKS

This invention is a continuation-in-part application of Ser. No. 704,136, filed July 12, 1976, now abandoned.

BACKGROUND OF THE INVENTION

1. Field of the Invention

This invention relates to a multi-compartment container for fragile disks, such as silicon wafers used in the manufacture of integrated circuits.

Silicon wafers used in the manufacture of electronic integrated circuits are extremely fragile and must be adequately protected against breakage during handling and shipping. An orderly form of packaging is further desired to minimize manual handling of individual wafers.

2. Description of Prior Art

A known cassette-type packing system for the shipping and automatic handling of multiple silicon wafers is manufactured by the Monsanto Company, Electronics Division, Palo Alto, California. The packaging system comprises a rigid polypropylene cassette container for containing silicon wafers in a compact, spaced apart stack. Each package or cassette is constructed by the assembly of a plurality of seperetely molded pieces. The wafers are stored in the grooves or slots of a rigid rack disposed within the cassette container, which in turn is enclosed within an outer tube. Due to the relative rigidity of the interior package, severe shocks may be transmitted to the enclosed silicon wafers resulting in breakage. Furthermore, the shape and construction of the containers are such as to require expensive tooling of molds and a relatively complex package assembly.

A number of patents disclose packaging systems for fragile objects. U.S. Pat. No. 2,811,246, to Sloan, discloses a packaging system having an outer protective box and an inner package for enclosing a fragile object. The inner package includes a spacer ridge which totally surrounds the object thereby prohibiting flexure of the interior package.

French Pat. No. 1,351,992 discloses a corrugated cookie package of very thin gauge material. U.S. Pat. No. 3,164,478, to Bostrum, discloses a dough-nut package of thin gauge material, but without the provision of a cooperating outer protective package. U.S. Pat. No. 3,740,238, to Graham, discloses a corrugated cookie package somewhat similar to the above referenced French Patent. However, no outer protective package is shown.

U.S. Pat. No. 3,223,234, to Weiss, discloses a packaging system for fluorescent tubes in which discrete end spacers and central spacers cooperate to space tubes inside an outer protective box.

Although the above patents generally disclose means for packaging fragile objects, none teaches or suggests an outer, relatively rigid package enclosing a bellows-like interior package flexibly suspended therein by end spacers the interior package being adapted to carry a stack of indentical fragile disks in coushioned spaced apart relation.

SUMMARY OF THE INVENTION

The present invention provides a multi-compartment container for fragile disks such as silicon wafers, which provides protection against shock and the like due to shipping and handling. The container provides for the clean storage and the safe handling and shipping of the fragile, relatively expensive wafers, while minimizing manual handling of the wafers.

The container comprises a generally tubular hollow bellows section formed of identical longitudinal halves from thin sheets of self-supportable flexible plastic sheet material. Each fold or inner groove of the bellows section defines a compartment for retaining a silicon wafer of a corresponding pre-selected or standardized size. Integral with the bellows section are end spacers flexibly coupled with the bellows section and of a diameter greater than the diameter of the bellows section. Each end spacer includes ridges adapted to confront the interior of a relatively rigid outer box for suspending the bellows section therein. In particular embodiments, the end spacers include an exterior annular ridge and trough for receiving a rubber band which is used to hold mating sections together during insertion and removal of the inner package from its outer container. The annular ridge includes an indentation of suitable size to accommodate the insertion of a finger beneath the rubber band in order to expedite the release of the rubber band and the opening of the package. Further, each half of the bellows section may include a longitudinal lip on one side margin and along the opposing side margin an integrally formed resilient longitudinal catch means. The catch means is formed as a lateral extension of flushing folded to overlap the longitudinal lip of an abutting indentical half section.

The lip and catch means combination cooperate with silicon wafers disposed within the inner container in order to cause the inner container to remain locked together so long as at least one wafer is enclosed in the package and the catch means is overlappingly engaging the longitudinal lip.

In addition, a longitudinal stiffening backbone is formed along the outer surface of the bellows section to prevent sag between the end spacers.

The container provides a flexible protective package which minimizes the risk of wafer breakage during shipping, handling and storage. The inner package shape is adapted to interface with the variety of automatic wafer processing equipment, thereby minimizing manual handling of silicon wafers.

The package is readily and inexpensively formed in identical mating halves of a thin sheet of resilient moldable plastic, such as thermoforming high-impact polystyrene of approximately 0.5 millimeter thickness. To form the package, a plastic sheet is heated an layed upon a vacuum mold tooled to the desired inner shape and form, thereby stretching the sheet to conform to the desired inside configuration.

BRIEF DESCRIPTON OF THE DRAWINGS

The invention may be more readily understood by reference to the following detailed description in conjunction with the accompanying drawings in which:

FIG. 1 is a side view and partial cutaway of the container of the invention;

FIG. 2 is a perspective view of a mold and a plastic sheet suitable for forming the container;

FIG. 3 illustrates the mold engaging and forming a half section of the container;

FIG. 4 is a perspective view of the molded, trimmed plastic sheet;

FIG. 5 is a perspective view of an alternative embodiment of a mold according to the invention;

FIG. 6 is a perspective view of a second embodiment of the invention illustrating the backbone ridge and rubber band receiving end portions of the inner container;

FIG. 7 is a perspective view in partial cutaway illustrating a further embodiment of the invention showing a side catch feature; and FIG. 8 is an end view of the embodiment of FIG. 7.

DETAILED DESCRIPTION OF THE PREFERRED EMBODIMENTS

In FIG. 1, a container 10 according to the present invention is illustrated, one end depicting an exterior side and the opposite end being cutaway to show an interior view in a cross-section. The container 10 comprises a generally axially symmetric tubular structure formed to two identical mating halves and having end walls 12 and 14 and adjacent octagonal spacer collars 16 and 18 defining end spacer sections. A central bellows section 20 is integrally formed and extends between the end spacer sections with bridge sections 19 and 23 joining the bellows section 20 and spacer collars 16 and 18. The bellows section 20 is generally circular in cross section to mate the wafers, which are generally manufactured in the form of circular disks.

Bellows section 20 comprises a plurality of folds defining annular, inner grooves 22 separated by annular ridges 24. The inner grooves 22 are each of sufficient breadth to receive and support a single silicon wafer, usually of a standardized diameter and thickness. The ridges 24 define the spacing between adjacent grooves 22 and therefore define a diameter less than the standardized diameter of a wafer. The wafers are thus maintained in a compact, spaced-apart stack within bellows section 20. Only spacer ridges 16 and 18 abut the inner wall of the protective packaging 21, flexibly suspending the bellows section 20, therein. Thus, the wafer stack is capable of flexure within a protective package 21. Such flexure permits shock absorbing action by the bellows 20 while minimizing direct transmittal of potentially destructive shock forces from the outer packaging.

The container 10 is typically formed of two identical axially symmetric half-section shells which are mateable along first and second flashings 26 and 28. The flashings 26 and 28 may be hinged to one another by a flexible tape or the like, permitting the container 10 to be conveniently opened and closed. The flashings 26 and 28 along the bellows section may or may not be closely trimmed, depending on the degree of flexibility desired. Where the flashings 26 and 28 are closely trimmed the degree of flexibility is increased.

External inertial forces to the package, both forces transverse and forces parallel to the container axis, as may result in shipping and in handling, will tend to be at least partially transmitted through the container 10. Severe transverse shocks, for example, will first cause deformation of the relatively rigid protective container 21. The bellows section 20 spaced from the protective package 21 by the spacer ridges 16 and 18 is flexible in response to transverse shocks. Thus, the bellows section 20, provides shock absorbing flexure minimizing the effect of shock and severe inertial forces on contained wafers, thereby providing them adequate protection against breakage.

A particular advantage of the present invention is the economy and ease of container fabrication. This is made possible by a particular mold embodiment and method for molding the container 10 components. According to the invention, a male die is provided which is shaped to conform to the desired inner surface contour of the container 10. A mold 30 according to the invention is shown in FIG. 2. The mold comprises a male half cylindrical die section 32 protruding from a flat plate 34. A mold of this configuration is relatively simple to tool, and is therefore relatively economical, as compared with wafer container molds of the known prior art.

FIGS. 2, 3 and 4 further illustrate the method of manufacture according to the invention. The container is preferably formed of a thin sheet of moldable thermoforming plastic, such as high impack polystrene. Also suitable are polyvinylchloride, cellulouse acetate, cellulouse butanate, cellulouse propynate, polyethelene, polypropylene, or ABS.

A thermoforming sheet of these materials may typically be about 0.020" (about 0.5 mm) in thickness in order to form a container of sufficient flexibility and strength.

To form the package, the thermoforming sheet is heated to a state of maleability, which is typically a surface temperature at 180° F. to 250° F. This may be accomplished rapidly in an oven heated to 850° F. Thereafter, while the sheet is still hot, a sheet section 38 of suitable length is indexed out and clamped in a plane by suitable means along the four edges 38 at a forming station proximate the mold 30. The mold 30 is thereupon brought into contact with a face of the sheet 36. A vacuum is applied to the mold side of the sheet 36 while air pressre is applied to the opposite side of the sheet 36, pressing the sheet onto the mold 30 to form an image of the half cylinder 32, as shown in FIG. 3. Thereafter, the molded sheet 36, is separated from the mold 30 and excess flashing 40 is trimmed from the molded half cylinder piece 41, the excess flashing being discarded or recycled.

A number of machines and tools are available which are useful in forming the molded pieces of this invention. For example, the Brown Model 1424 vacuum forming machine, manufactured by the Brown Machine Co. of Beaverton, Michigan, may be operated according to the present method. The excess flashing 40 may be cut off, for example, by a steel cutting die or mating cutting dies shaped to conform to the desired outline of the half cylinder 41.

The entire cylinder 10 (FIG. 1) is formed by joining two identical symmetric half cylinder sections 41 (FIG. 4). For example, flashing 26 and 28 (FIG. 1) may be joined by tape or the like sealing the container.

As an alternative embodiment, both half sections 41 of the container 10 may be formed of a single plastic sheet according to the above vacuum forming process. For example, as depicted in FIG. 5 a pair of male half cylinder dies may be disposed adjacent one another on the backing plate 34 so that each section may be formed simultaneously. Furthermore, the sides of dies 32 may be located sufficiently close to one another to share a common boundary 42. In such an embodiment, the common boundary 42 may serve as an integrally molded hinge for the finished container 10.

Turning now to FIG. 6, there is shown in perspective view a further embodiment of the invention incorporating still further inventive features. The container 10' comprises a generally axially symmetric tubular structure formed of two identical mating halves 11A and 11B and having end walls 12 and 14 and adjacent octagonal spacer collars 16 and 18 defining end spacer sections. A central bellows section 20 is integrally formed and extends between the end spacer sections with bridge sections 19 and 21 ajoining the bellows section 20 with the spacer collars 16 and 18. The bellows section 20 is generally circular in corss section and includes along its outer surface a longitudinal integrally formed substantially rigid rib section 50. The rib section 50 terminates at the bridge sections 19 and 21 so that limited longitudinal flexure is permitted between the collars 16 and 18 and the bollows section 20.

The end walls 12 and 14 include an exterior annular ridge 52 and trough 54 for receiving a rubber band A which is used to hold the mating half sections together.

The annular ridge 52 includes an indentation 56 of suitable size to accommodate the insertion of a finger beneath the rubber band A while in position in the trough 54. This indentation 56 therefore accommodates an easy release of the rubber band A in order to open the container 10.

Referring now to FIGS. 7 and 8, there is shown another embodiment of the invention. The container 10" at its side margins includes first and second flashings 26 and 28 which are adapted to abut one another. Extending from one flashing 26 on one side of the container is a longitudinally extended resilient catch means 58. The catch means 58 is an extension of the flashing 26 and includes a reverse fold or radially inwardly disposed portion 60 adapted to interlock with the abutting flashing 28 or side margin. Each half of container 10" includes only one longitudinal fold 60 such that identical halves can be disposed to mate with one another allowing the halves 11A, 11B to slide longitudinally with respect to one another if there is no other constraint on longitudinal movement. Furthermore, each catch means 58 includes a tab 62 extending from the fold portion 60. The tab 62 both acts as a guide to facilitate opening of the fold portion when the container 10" is being pressed closed and allows one to pull the fold portion 60 away from the flashing 28 so that the container 10" can be opened.

A particular feature of the invention is the manner in which the container 10" which the latch means 58 cooperates with a disk B enclosed therein to hold the container 10" closed. In particular, when at least one disk B (FIG. 7) is enclosed within the container 10" and received within the interior grooves 22 of each half 11A or 11B the disk B locks the halves 11A, 11B against longitudinal movement relative to one another. As a consequence, the container 10" is secured in its closed position and can be opened only by the use of tabs 62 along the side margins.

The invention has been described with reference to specific embodiments. Other embodiments will be obvious to those of ordinary skill in the art in view of the present specifications. Therefore it is not intended that the invention be limited except as indicated by the appended claims.

I claim:

1. A multi-compartment container receivable within a relatively rigid outer protective package comprising:
   a cylindrical hollow bellows section formed of a resilient plastic sheet, said bellows section having a diameter less than a minimum lateral diameter of said outer package, said section having on an inner surface thereof a plurality of alternate angular parallel grooves and ridges cooperating to define a plurality of compartments;
   A pair of end spacer sections disposed at respective ends of and integral with said bellows section; and
   rib means transverse of said grooves and ridges beetween the respective ends of an integral with said grooves and ridges,
   said end spacer sections including an exterior ridge and adjacent groove portion for receiving a rubber band,
   said exterior ridge including an indentation adapted to permit the insertion of a finger for expediting the release of the rubber band from said exterior groove,
   said end sections being of a diameter greater than the diameter of said bellows section and adapted to abut the inner walls of said outer package to suspend said bellows section between said end spacers sections in said outer package spaced therefrom the protecting fragile disks contained in said container.

2. A multi-compartment container according to claim 1, whrein said each said bellows section is identical and said bellows section includes catch means along one side margin for engaging an abutting side margin of a mating bellows section, said catch means cooperating with a disk disposed within said container to impede relative longitudinal movement of mating bellows sections.

3. A multi-compartment container according to claim 2, wherein said catch means comprises a resilient longitudinal inwardly diverted fold extending from said side margin and adapted to interlocking overlap the opposing side margin of said mating bellows section and further including a tab extending from said fold for providing a guide for spreading said fold upon container closure and a grip for opening said fold to release said catch means.

4. A container according to claim 1, wherein said bellows structure is of a circular cross section transverse of the central axis, said disks comprising circular, wafers.

5. A container according to claim 1, wherein the said container comprises thermoformed molded plastic approximately 0.5 mm in thickness.

6. A container according to claim 5, wherein said plastic comprises high impact polyethylene.

* * * * *